(12) United States Patent
Kim et al.

(10) Patent No.: US 7,473,963 B2
(45) Date of Patent: Jan. 6, 2009

(54) METAL OXIDE SEMICONDUCTOR (MOS) TRANSISTORS HAVING THREE DIMENSIONAL CHANNELS

(75) Inventors: Sung-Min Kim, Incheon (KR); Dong-Won Kim, Gyeonggi-do (KR); Eun-Jung Yun, Seoul (KR); Dong-Gun Park, Gyeonggi-do (KR); Sung-Young Lee, Gyeonggi-do (KR); Jeong-Dong Choe, Gyeonggi-do (KR); Shin-Ae Lee, Seoul (KR); Hye-Jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/854,734

(22) Filed: Sep. 13, 2007

(65) Prior Publication Data

US 2008/0001218 A1    Jan. 3, 2008

Related U.S. Application Data

(62) Division of application No. 10/909,471, filed on Aug. 2, 2004, now Pat. No. 7,285,466.

(30) Foreign Application Priority Data

Aug. 5, 2003   (KR) ............................. 2003-54192
May 13, 2004  (KR) ............................. 2004-34025

(51) Int. Cl.
    *H01L 29/78*    (2006.01)
(52) U.S. Cl. ................. 257/327; 257/330; 257/E29.259
(58) Field of Classification Search ......... 257/327–328, 257/330, 332
    See application file for complete search history.

(56) References Cited

U.S. PATENT DOCUMENTS 4,393,391 A    7/1983  Blanchard (Continued)

FOREIGN PATENT DOCUMENTS

JP   2003-303908   10/2003
KR   2002-096654   12/2002

OTHER PUBLICATIONS

Office Action issued by the Chinese Patent Office corresponding to Chinese Patent Application No. 200410055895.5, mailed Feb. 16, 2007.

*Primary Examiner*—M. Wilczewski
*Assistant Examiner*—Toniae M. Thomas
(74) *Attorney, Agent, or Firm*—Myers Bigel Sibley & Sajovec

(57) ABSTRACT

Unit cells of metal oxide semiconductor (MOS) transistors are provided including an integrated circuit substrate and a MOS transistor on the integrated circuit substrate. The MOS transistor has a source region, a drain region and a gate region, the gate region being between the source region and the drain region. First and second channel regions are provided between the source and drain regions. The channel region is defined by first and second spaced apart protrusions in the integrated circuit substrate separated by a trench region. The first and second protrusions extend away from the integrated circuit substrate and upper surfaces of the first and second protrusions are substantially planar with upper surfaces of the source and drain regions. A gate electrode is provided in the trench region extending on sidewalls of the first and second spaced apart protrusions and on at least a portion of surfaces of the first and second spaced apart protrusions.

16 Claims, 23 Drawing Sheets

U.S. PATENT DOCUMENTS

| | | |
|---|---|---|
| 6,413,802 B1 | 7/2002 | Hu et al. |
| 6,635,923 B2 * | 10/2003 | Hanafi et al. ................ 257/327 |
| 6,660,596 B2 * | 12/2003 | Adkisson et al. ............ 438/286 |
| 6,673,682 B2 * | 1/2004 | Chang ........................ 438/276 |
| 6,960,507 B2 * | 11/2005 | Kim et al. ................... 438/270 |
| 7,122,431 B2 * | 10/2006 | Kim et al. ................... 438/259 |
| 7,189,617 B2 * | 3/2007 | Slesazeck et al. ........... 438/259 |
| 7,285,456 B2 * | 10/2007 | Kim et al. ................... 438/209 |
| 2004/0207008 A1 * | 10/2004 | Hadizad et al. ............. 257/327 |
| 2006/0046407 A1 * | 3/2006 | Juengling ................... 438/301 |

\* cited by examiner

METAL OXIDE SEMICONDUCTOR (MOS) TRANSISTORS HAVING THREE DIMENSIONAL CHANNELS

REFERENCE TO PRIORITY APPLICATIONS

This application is a divisional of U.S. application Ser. No. 10/909,471, filed Aug. 2, 2004, now U.S. Pat. No. 7,285,466 which claims priority to Korean Application Serial Nos. 2003-54192, filed Aug. 5, 2003 and 2004-34025, filed May 13, 2004, the disclosures of which are hereby incorporated herein by reference.

FIELD OF THE INVENTION

The present invention relates to semiconductor devices and methods of fabricating the same and, more particularly, to metal oxide semiconductor (MOS) transistors and methods of fabricating the same.

BACKGROUND OF THE INVENTION

Recently, integrated circuit devices have become more highly integrated. To provide highly integrated circuit devices, the dimensions of the integrated circuit devices, for example, field effect transistors (FETs), have been reduced. For example, a channel length of a FET has generally been shortened from about 20 to about 30 nm. Once the size of these devices has been reduced, it may be difficult to control the influence of drain potential on source and channel potentials due to a short channel effect.

Conventional, complementary metal oxide semiconductor (CMOS) transistors have horizontal channels, i.e. have channels that are parallel to a surface of an integrated circuit substrate. Devices having horizontal channels may have a structural disadvantage when the dimensions of the device are reduced, for example, an increased occurrence of the short channel effect.

To address the issue with respect to CMOS transistors, a double gate FET has been proposed to control a channel potential. In particular, channel potential may be controlled by arranging gates on both sides of the channel. Furthermore, Fin Field Effect Transistors (Fin-FETs), such as those disclosed in U.S. Pat. No. 6,413,802 B1, entitled Fin-FET Transistor Structures Having a Double Gate Channel Extending Vertically From a Substrate and Methods of Manufacture to Chenming Hu et al., in which double gates are provided on the sides of the channel to provide an enhanced drive current and reduce the likelihood of the occurrence of the short channel effect. Furthermore, the double gate Fin-FET device includes a vertical channel, unlike conventional CMOS transistors including the horizontal channel and, thus, may provide advantages over the horizontal channel device. In particular, vertical channel structures may be smaller relative to horizontal devices and may be highly compatible with methods of fabricating conventional CMOS transistors having horizontal channels.

Methods of fabricating integrated circuit devices having three dimensional channels on an integrated circuit substrate may include a photolithography process. However, the extent to which a line width may be reduced using a photolithography process may be limited. Thus, methods providing a spacer in the process of forming the three dimensional channel have been developed.

Referring now to FIGS. 1A through 4C, conventional methods of fabricating MOS transistors will be discussed. FIGS. 1A through 4A are top views illustrating processing steps in the fabrication of conventional metal oxide semiconductor (MOS) transistors. FIGS. 1B through 4B are cross-sectional views taken along the line A-A' of FIGS. 1A through 4A, respectively, illustrating processing steps in the fabrication of conventional MOS transistors. FIGS. 1C through 4C are cross-sectional views taken along the line B-B' of FIGS. 1A through 4A, respectively, illustrating processing steps in the fabrication of conventional MOS transistors.

As illustrated in FIGS. 1A through 1C, a mask pattern M is formed on an active region of an integrated circuit substrate 10. Subsequently, the integrated circuit substrate 10 is etched using the mask pattern M as an etch mask to form a trench around the active region. An insulating layer is formed on the integrated circuit substrate 10. In the trench, the insulating layer is removed to expose the mask pattern M forming an isolation layer 11 in the trench. As illustrated in FIGS. 2A through 2C, the mask pattern M is removed to expose a surface of the integrated circuit substrate 10 and sidewalls of the isolation layer 11. The active region has a length of 'L1' and a width of 'W1' as illustrated in FIG. 2A.

Referring now to FIGS. 3A through 3C, a spacer 13 is formed on the sidewalls of the exposed isolation layer 11 where the mask has been removed. The integrated circuit substrate 10 is etched to form a trench 14 in the integrated circuit substrate 10 using the isolation layer 11 and the spacer 13 as an etch mask. As illustrated in FIGS. 4A through 4C, the spacer 13 is removed to expose the integrated circuit substrate 10 and a portion of the isolation layer 11 is also removed. As illustrated in FIG. 4C, portions of the integrated circuit substrate 10 protrude from a surface of the isolation layer 11. The protruded portions define channel regions C that are parallel to each other.

As discussed above, conventional methods of fabricating integrated circuit devices may form a trench 14 using a spacer 13 positioned on an edge of the active region. Thus, an area of the active region may be reduced in proportion to a width of the spacer. In other words, as illustrated in FIGS. 2A and 4A, in the active region, the length 'L1' and the width 'W1' of the active region (FIG. 2A) may be reduced to a length of 'L2' and a width of 'W2' (FIG. 3A) after the spacer is formed. Accordingly, improved methods of fabricating integrated circuit devices may be desired.

SUMMARY OF THE INVENTION

Embodiments of the present invention provide unit cells of metal oxide semiconductor (MOS) transistors including an integrated circuit substrate and a MOS transistor on the integrated circuit substrate. The MOS transistor has a source region, a drain region and a gate region, the gate region being between the source region and the drain region. First and second channel regions are provided between the source and drain regions. The channel region is defined by first and second spaced apart protrusions in the integrated circuit substrate separated by a trench region. The first and second protrusions extend away from the integrated circuit substrate and upper surfaces of the first and second protrusions are substantially planar with upper surfaces of the source and drain regions. A gate electrode is provided in the trench region extending on sidewalls of the first and second spaced apart protrusions and on at least a portion of surfaces of the first and second spaced apart protrusions.

In some embodiments of the present invention, an isolation layer may be provided on the integrated circuit substrate such that the source region, drain region, gate region and first and second channel regions are free of the isolation layer. The isolation layer may have an upper surface that is lower than upper surfaces of the first and second channel regions. A bottom surface of the trench region may be higher than a bottom surface of the isolation layer on the integrated circuit substrate. The bottom surface of the trench region may be substantially planar with or lower than the upper surface of the isolation layer.

In further embodiments of the present invention, the first channel region may be electrically coupled to the source region at a first end of the first channel region and to the drain region at a second end of the first channel region and the second channel region is electrically coupled to the source region at a first end of the second channel region and the drain region at a second end of the second channel region.

In still further embodiments of the present invention, the gate electrode may extend on surfaces of the source and drain regions and a width of the gate electrode may be greater than a width of the trench region. In certain embodiments of the present invention, the gate electrode may have a width that is equal to the width of the trench region. A gate spacer may be provided on sidewalls of the trench region and the gate electrode may be provided on the gate spacer such that a width of the gate electrode is less than a width of the trench region.

In some embodiments of the present invention, a conformal gate insulating layer may be provided between the first and second protrusions and the gate electrode. The gate insulating layer may include at least one of an oxide layer, a nitride layer, an aluminum layer, a high dielectric layer and an insulating layer including nano-crystalline silicon. A channel formation prevention region may be provided on a floor of the trench region and may be positioned between the integrated circuit substrate and the gate insulating layer.

In further embodiments of the present invention, a silicon layer, a germanium layer and/or a silicon germanium layer may be provided on the source and drain regions. In certain embodiments of the present invention, a buried insulating layer may be provided on a floor of the trench region. A strain inducing layer may be provided on the integrated circuit substrate including the gate electrode. The corners of the first and second channel regions and the trench region may be slightly rounded. The first channel region may have a first doping concentration and the second channel region may have a second doping concentration, different from the first concentration.

While the present invention is described above primarily with reference to MOS transistors, methods of fabricating MOS transistors are also provided herein.

BRIEF DESCRIPTION OF THE DRAWINGS

FIGS. 1A through 4A are top views illustrating processing steps in the fabrication of conventional metal oxide semiconductor (MOS) transistors.

FIGS. 1B through 4B are cross-sectional views taken along the line A-A' of FIGS. 1A through 4A, respectively, illustrating processing steps in the fabrication of conventional MOS transistors.

FIGS. 1C through 4C are cross-sectional views taken along the line B-B' of FIGS. 1A through 4A, respectively, illustrating processing steps in the fabrication of conventional MOS transistors.

FIGS. 5A through 16A are top views illustrating processing steps in the fabrication of MOS transistors according to some embodiments of the present invention.

FIGS. 5B through 16B are cross-sectional views taken along the line A-A' of FIGS. 5A through 16A, respectively, illustrating processing steps in the fabrication of MOS transistors according to some embodiments of the present invention.

FIGS. 5C through 16C are cross-sectional views taken along the line B-B' of FIGS. 5A through 16A, respectively, illustrating processing steps in the fabrication of MOS transistors according to some embodiments of the present invention.

FIGS. 17A through 20A are top views illustrating processing steps in the fabrication of MOS transistors according to further embodiments of the present invention.

FIGS. 17B through 20B are cross-sectional views taken along the line A-A' of FIGS. 17A through 20A, respectively, illustrating processing steps in the fabrication of MOS transistors according to further embodiments of the present invention.

FIGS. 17C through 20C are cross-sectional views taken along line B-B' of FIGS. 17A through 20A, respectively, illustrating processing steps in the fabrication of MOS transistors according to further embodiments of the present invention.

DETAILED DESCRIPTION

Figure 1A:
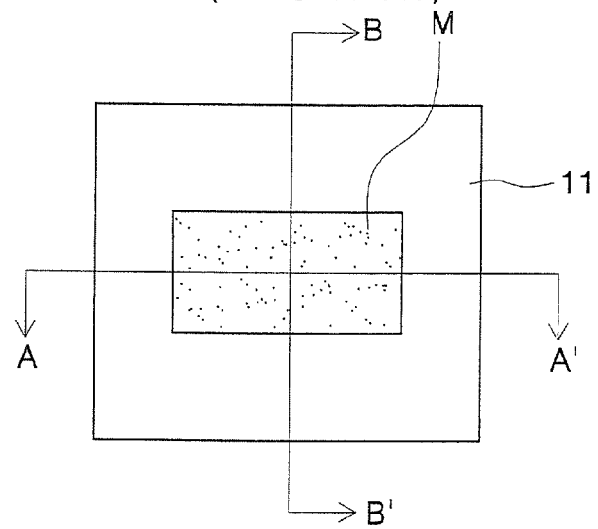
Figure 1B:
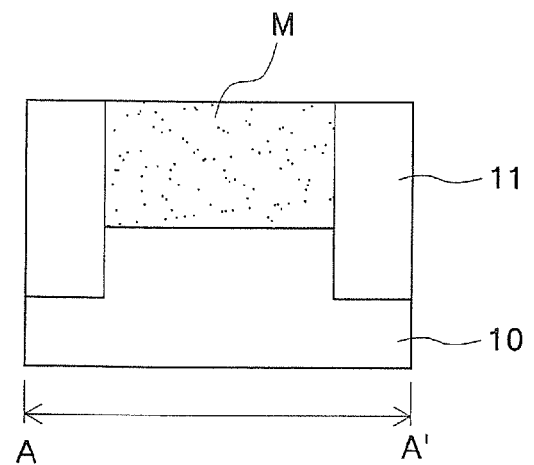
Figure 1C:
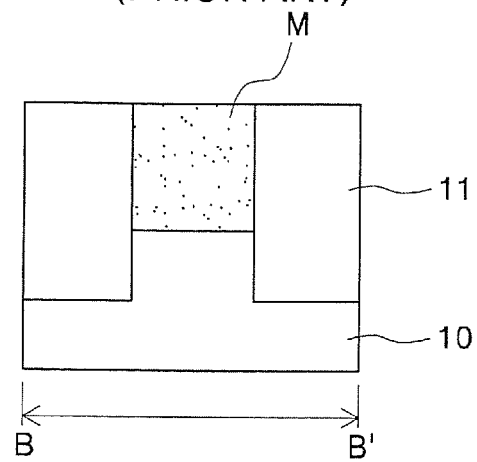
Figure 2A:
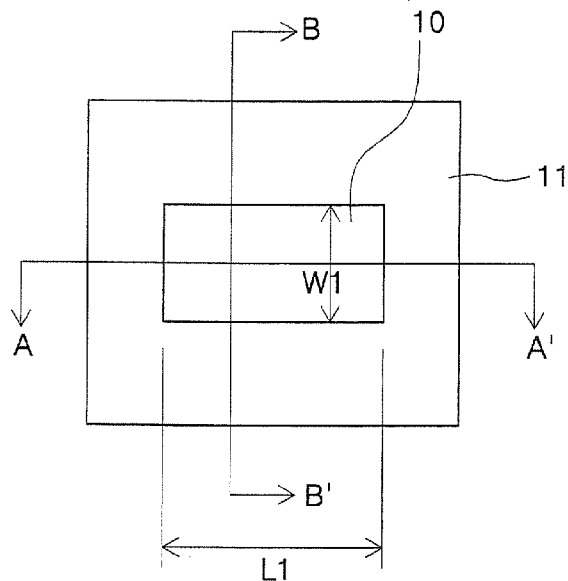
Figure 2B:
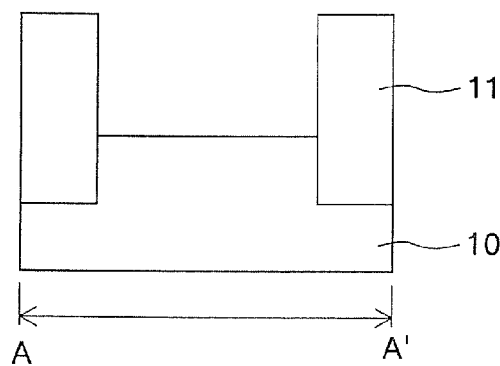
Figure 2C:
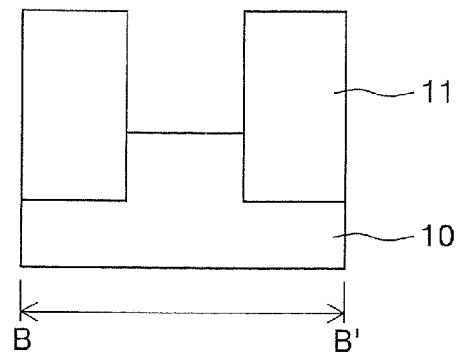
Figure 3A:
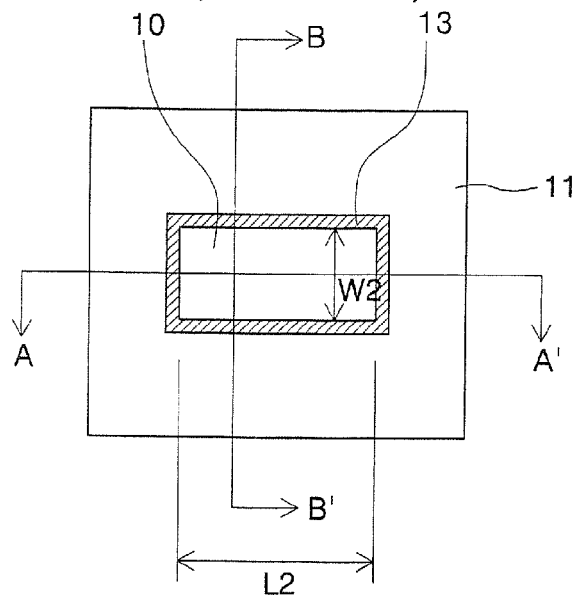
Figure 3B:
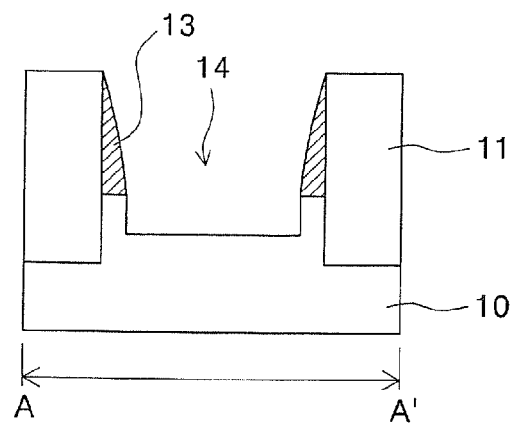
Figure 3C:
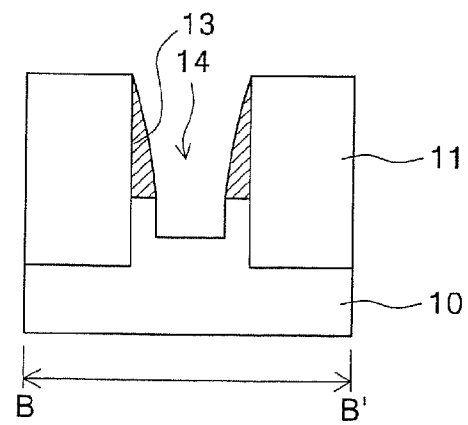
Figure 4A:
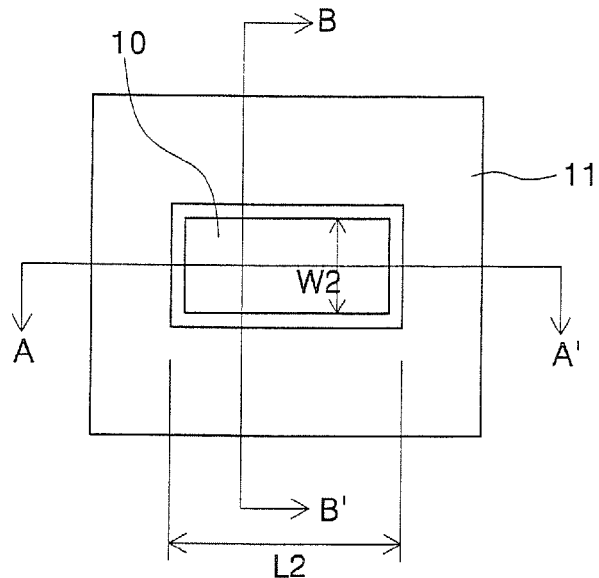
Figure 4B:
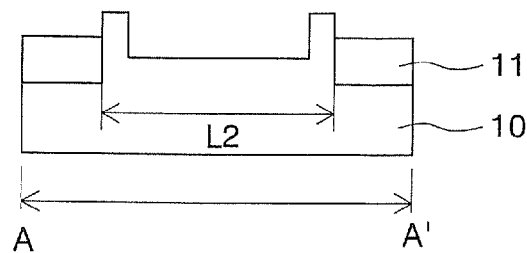
Figure 4C:
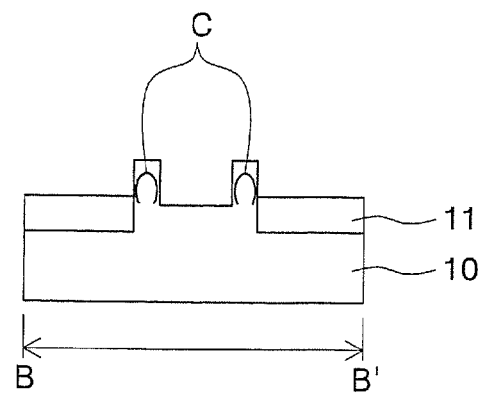

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that although the terms first and second are used herein to describe various layers, these layers should not be limited by these terms. These terms are only used to distinguish one layer from another layer. Thus, a first layer discussed below could be termed a second layer, and similarly, a second layer may be termed a first layer without departing from the teachings of the present invention.

It will be understood that when an element such as a layer, region or substrate is referred to as being "on" another element, it can be directly on the other element or intervening elements may also be present. The term "directly on" means that there are no intervening elements. It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIGS. 5A through 16C, processing steps in the fabrication of metal oxide semiconductor (MOS) transistors according to some embodiments of the present invention will be discussed. FIGS. 5A through 16A are top views illustrating processing steps in the fabrication of MOS transistors according to some embodiments of the present invention. FIGS. 5B through 16B are cross-sectional views taken along the line A-A' of FIGS. 5A through 16A, respectively, illustrating processing steps in the fabrication of MOS transistors according to some embodiments of the present invention. FIGS. 5C through 16C are cross-sectional views taken along the line B-B' of FIGS. 5A through 16A, respectively, illustrating processing steps in the fabrication of MOS transistors according to some embodiments of the present invention.

Figure 5A:
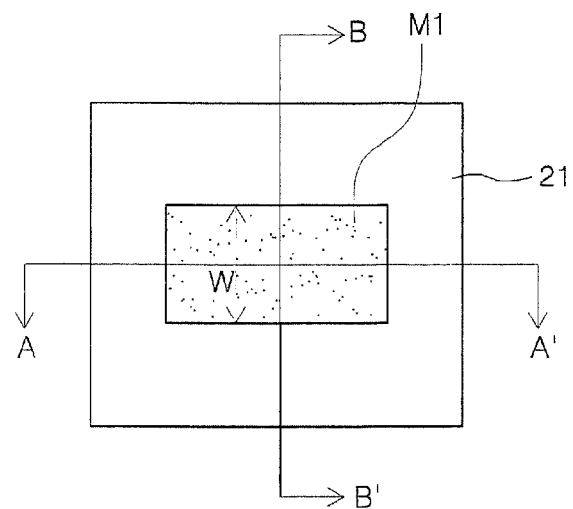
Figure 5B:
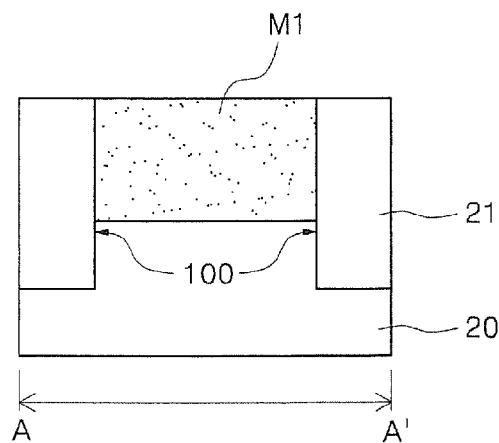
Figure 5C:
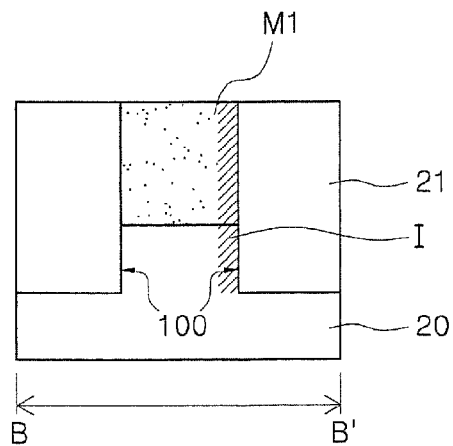

Referring now to FIGS. 5A through 5C, an active region masking pattern M1 is formed on an active region of an integrated circuit substrate 20. The active region masking pattern M1 may include a nitride layer having a thickness of from about 800 Å to about 2,000 Å. The integrated circuit substrate 20 is etched according to the active region masking pattern M1 to form an isolation trench 100. In some embodiments of the present invention, the isolation trench 100 may have a depth of from about 1,000 Å to about 2,000 Å.

In some embodiments of the present invention, channels of the MOS transistor may have different threshold voltages. In these embodiments, a vertical doped layer I may be provided on a sidewall of the isolation trench 100 as illustrated in FIG. 5C. The vertical doped layer I may be formed by, for example, doping one sidewall of the isolation trench 100 using a tilted ion implantation process. It will be understood that the vertical doped layer I of FIG. 5C is provided for exemplary purposes only and that embodiments of the present invention are not limited to this configuration. For example, embodiments of the present invention may be provided without a vertical doped layer I without departing from the scope of the present invention.

An insulating layer 21 is formed on the integrated circuit substrate 20 including the isolation trench 100. In some embodiments of the present invention, the insulating layer 21 includes an oxide layer. The insulating layer 21 is planarized by, for example, blanket etching or Chemical-Mechanical Polishing (CMP) until a surface of the active region masking pattern M1 is exposed.

Figure 6A:
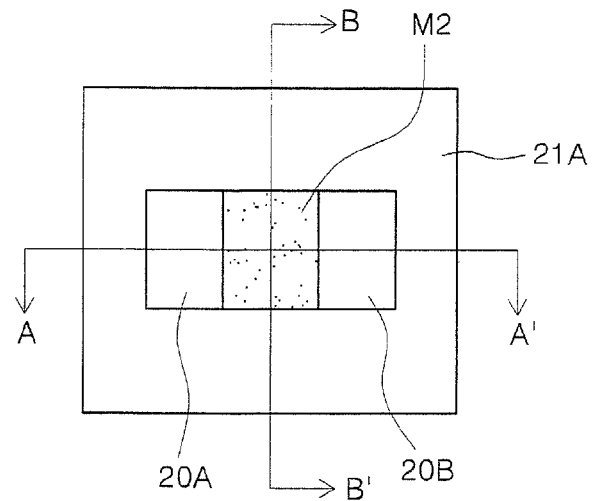
Figure 6B:
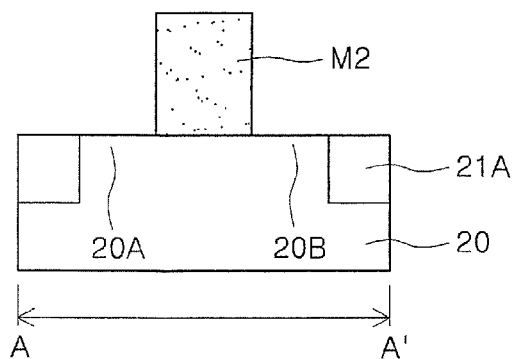
Figure 6C:
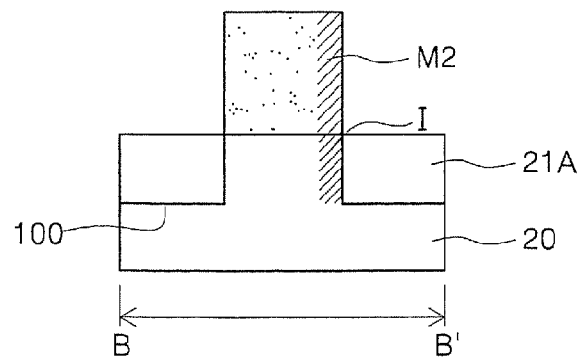

As illustrated in FIGS. 6A through 6C, the active region masking pattern M1 is selectively etched to form a source and drain region defining pattern M2. A source region 20A and a drain region 20B are exposed on ends of the source and drain region defining pattern M2. The insulating layer 21 is etched to form an isolation layer 21A having a shallow trench isolation (STI) structure within the isolation trench. In some embodiments of the present invention, the isolation layer 21A may only be provided in a portion of the isolation trench.

Figure 7A:
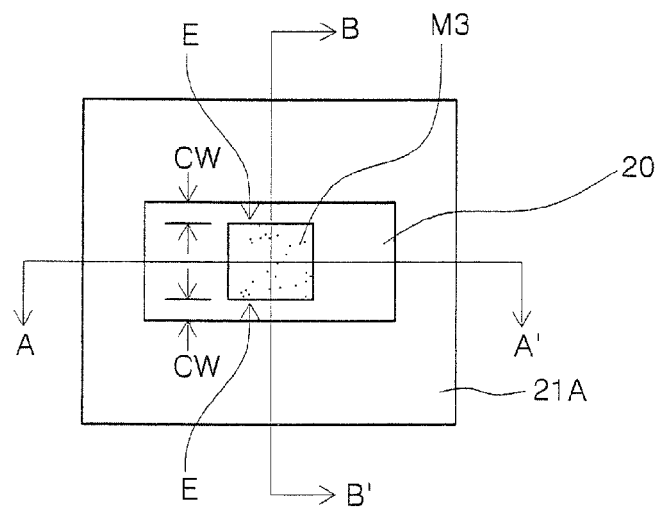
Figure 7B:
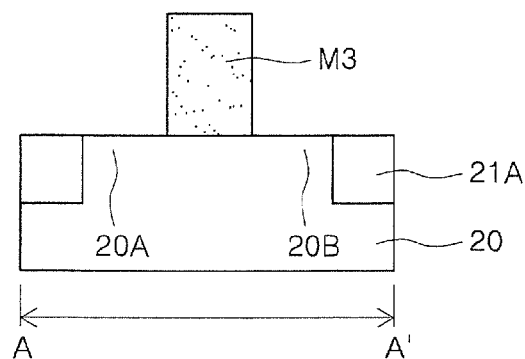
Figure 7C:
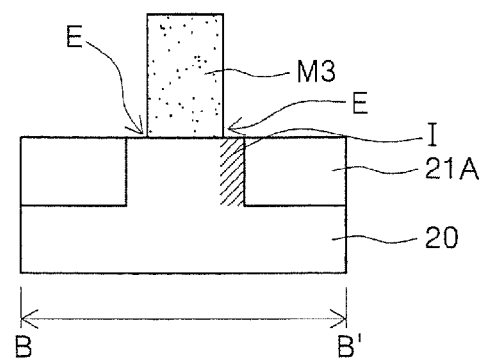

As illustrated in FIGS. 7A through 7C, the source and drain region defining pattern M2 is patterned to form a channel region defining pattern M3. The width and length of the channel region defining pattern M3 are smaller than the width and length of the source and drain region defining pattern M2. Edges E of the active region between the source region 20A and the drain region 20B are exposed by the formation of the channel region defining pattern M3. The source and drain region defining pattern M2 is, for example, isotropically etched, such as blanket etching in which an etch mask is not used, to provide the channel region defining pattern M3. In some embodiments of the present invention, the isotropic etching may be performed by, for example, wet etching with phosphoric acid or dry etching with plasma. A difference between the width of the source and drain region defining pattern M2 and the width of the channel region defining pattern M3 leads may be used to determine a value of a channel width CW.

Figure 8A:
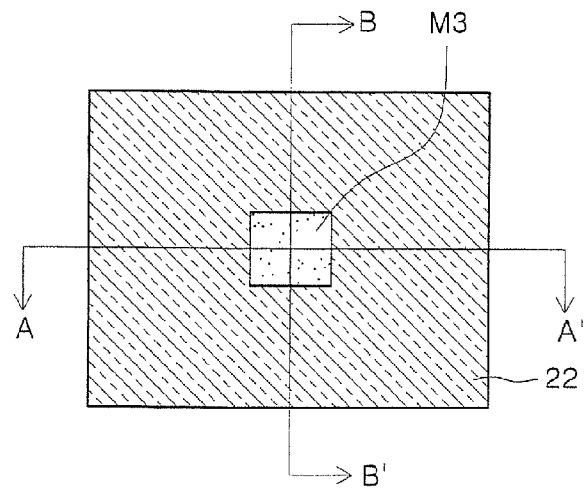
Figure 8B:
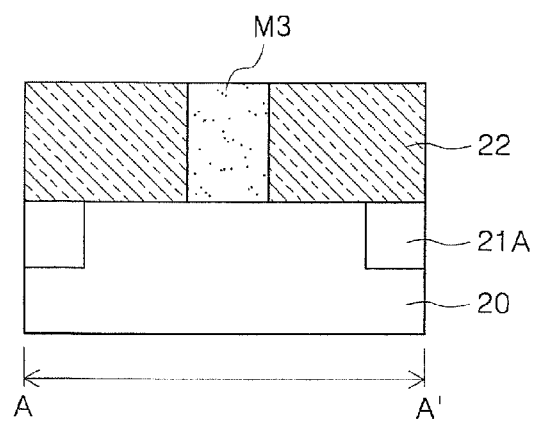
Figure 8C:
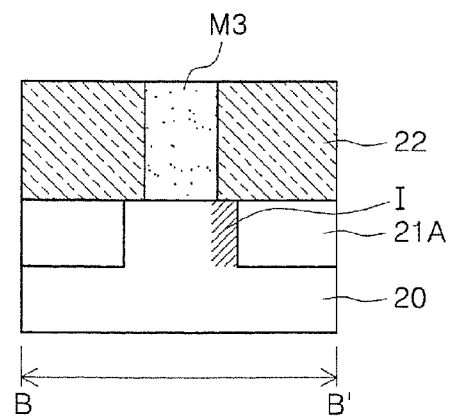

As illustrated in FIGS. 8A through 8C, a masking layer 22 is formed on the integrated circuit substrate 20 on which formation of the channel region defining pattern M3 is completed. The masking layer 22 is planarized by, for example, blanket etching or chemical mechanical polishing (CMP) until a surface of the channel region defining pattern M3 is exposed. In some embodiments of the present invention, the masking layer 22 may include, for example, an oxide layer.

Figure 9A:
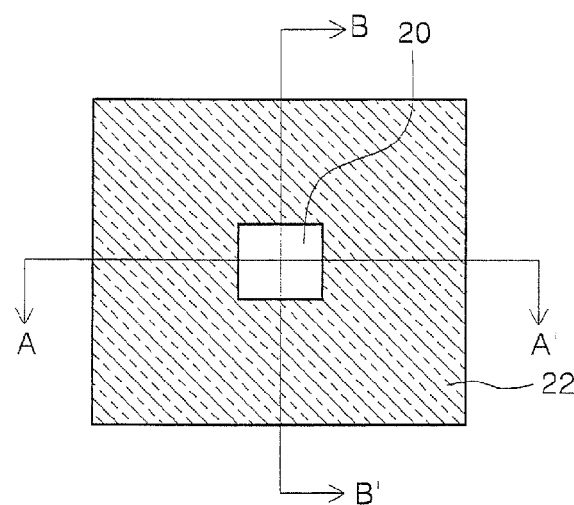
Figure 9B:
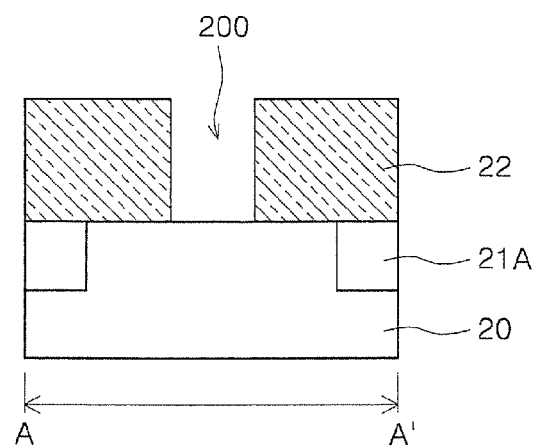
Figure 9C:
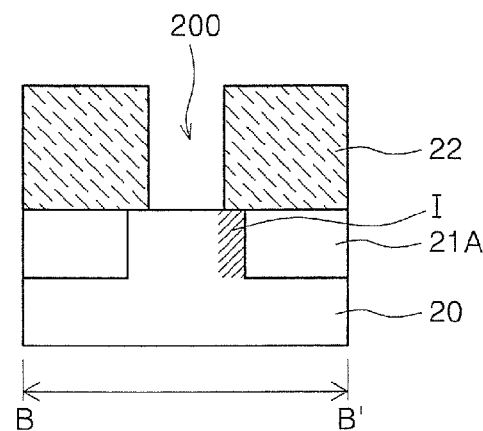

As illustrated in FIGS. 9A through 9C, an opening 200 is formed in the masking layer 22 by removing the channel region defining pattern M3 to expose a surface of the integrated circuit substrate 20. In some embodiments of the present invention, the channel region defining pattern M3 is removed by wet etching using phosphoric acid. A channel ion implantation process may be performed on the integrated circuit substrate 20 including the opening 200. A channel doping region for the channel ion implantation process is formed within the active region on the lower portion of the masking layer 22. In some embodiments of the present invention, the ion implantation process may be performed several times using different energies, a channel doping region may be vertically formed within the active region.

Figure 10A:
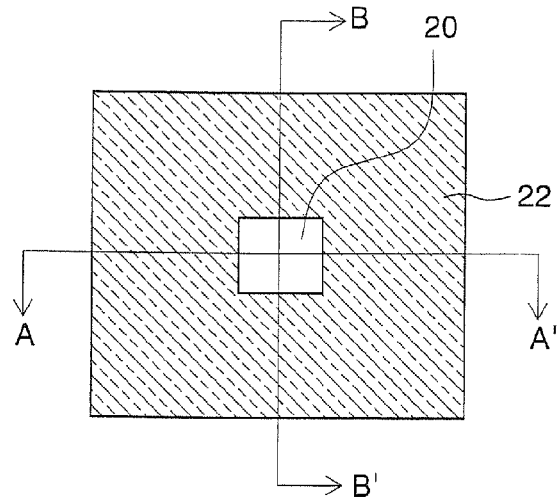
Figure 10B:
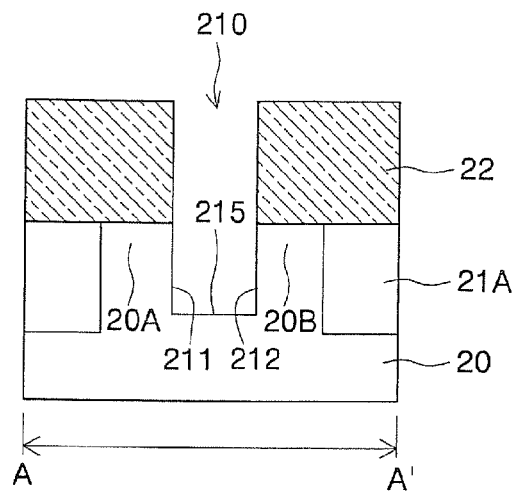
Figure 10C:
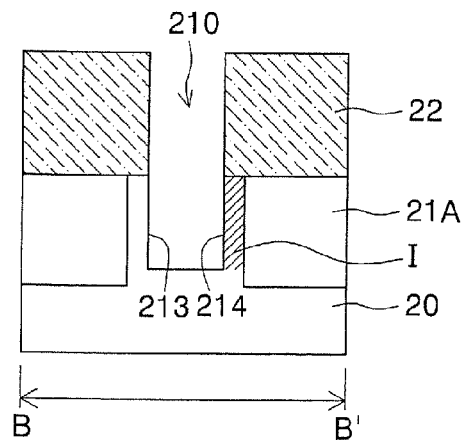

As illustrated in FIGS. 10A through 10C, the integrated circuit substrate 20 exposed after the opening 200 is formed is etched to form a center trench 210 in the integrated circuit substrate 20 between the source region 20A and the drain region 20B. The center trench 210 includes a first sidewall 211 which contacts to the source region 20A, a second sidewall 212 which faces the first sidewall 211 and contacts to the drain region 20B, third and fourth sidewalls 213 and 214 which are formed between the first and second sidewalls 211 and 212 and face each other and a bottom surface 215. The bottom surface 215 of the center trench 210 may be higher than a bottom surface of the isolation layer 21A.

Dimensions of the center trench 210 formed between the source and drain regions 20A and 20B may be determined by the dimensions of the opening 200, which are defined by the channel region defining pattern M3. Thus, in some embodiments of the present invention, in order to increase an area of each of the source and drain regions 20A and 20B, the width of the channel region defining pattern M3 should be as narrow as possible. For example, in some embodiments of the present invention a width of the channel region defining pattern M3 may be equal to or less than a width of a gate electrode.

Figure 11A:
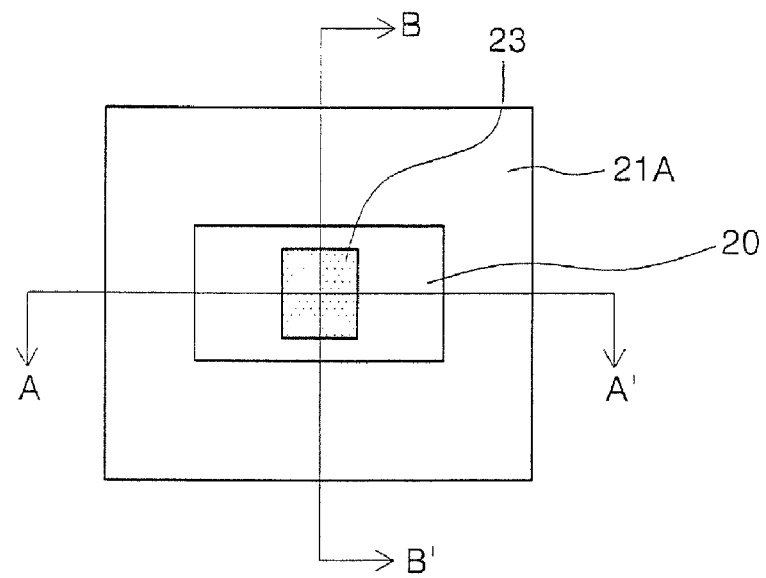
Figure 11B:
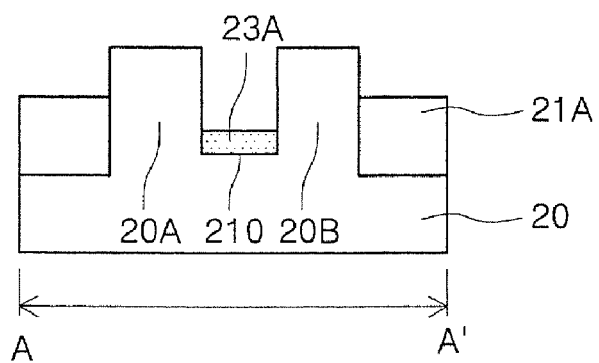
Figure 11C:
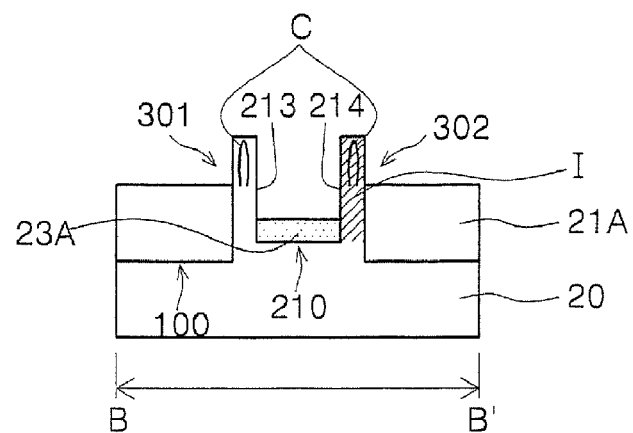

As illustrated in FIGS. 11A through 11C, the isolation layer 21A is recessed by over-etching while removing the masking layer 22. An upper surface of the recessed isolation layer 21A is may be formed to be substantially planar with or higher than the bottom surface of the center trench 210. Thus, a first protrusion 301 and a second protrusion 302, formed on the integrated circuit substrate 20 between the isolation layer 21A and the center trench 210, are formed. The first and second protrusions 301 and 302 have upper surfaces and sidewalls, which define first and second channel regions C. The first and second protrusions 301 and 302 have a center trench 210 therebetween and are parallel to each other. The upper surfaces of the first and second protrusions 301 and 302 are substantially planar with upper surfaces of the source and drain regions 20A and 20B.

One sidewall of the first protrusion 301 functions as the third sidewall 213 of the center trench 210. One sidewall of the second protrusion 302 facing the first protrusion 301 functions as the fourth sidewall 214 of the center trench 210. In some embodiments of the present invention, the first and second channel regions C have two different threshold voltages. For example, as illustrated in FIG. 11C the second protrusion 302 includes the vertical doped layer I, which is formed on the integrated circuit substrate using, for example, tilted ion implantation. Thus, the first and second protrusions 301 and 302 may have different channel doping concentrations. Accordingly, it may be possible to manufacture a MOS transistor having two threshold voltages Vth. Each of the source and drain regions 20A and 20B may be coupled to opposite ends of the first and second protrusions 301 and 302.

In some embodiments of the present invention, the isolation trench 100 may only be partially filled with an isolation layer 21A. In these embodiments of the present invention, the over-etching may be omitted, because the first and second protrusions 301 and 302 may already be formed on the integrated circuit substrate 20 between the isolation layer 21A and the center trench 210 during the formation of the isolation layer 21A. Thus, by removing the masking layer 22 without over-etching, the first and second protrusions 301 and 302 may be exposed. After the first and second protrusions 301 and 302 are formed or exposed, a channel formation prevention region 23A may be formed on the bottom surface of the center trench 210.

Figure 11D:
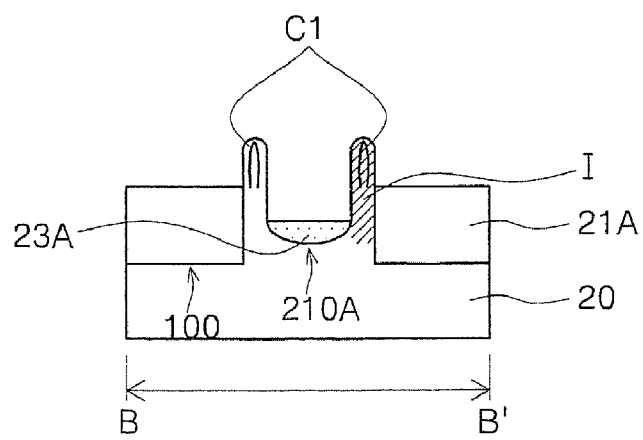
FIG. 11D is a cross-sectional view taken along the line B-B' of FIG. 11A illustrating processing steps in the Fabrication of MOS transistors according to embodiments of the present invention.

As illustrated in FIG. 11D, in some embodiments of the present invention, before the channel formation prevention region 23A is formed, the channel regions C and the corners of the center trench 210 may be rounded to have a slightly curved surface by, for example, annealing the integrated circuit substrate having the first and second protrusions 301 and 302 in an atmosphere of $H_2$ or Ar. Thus, a channel region C1 and a center trench 210A, both of which have slightly curved surfaces, are formed. In other words, when the first and second protrusions 301 and 302 have angled corners, a parasitic channel may be formed at the angled corners and, therefore, the threshold voltages may be lowered. To address this issue, some embodiments of the present invention have slightly rounded corners. A channel formation prevention region 23A may be formed on the bottom surface of the center trench 210.

Figure 12A:
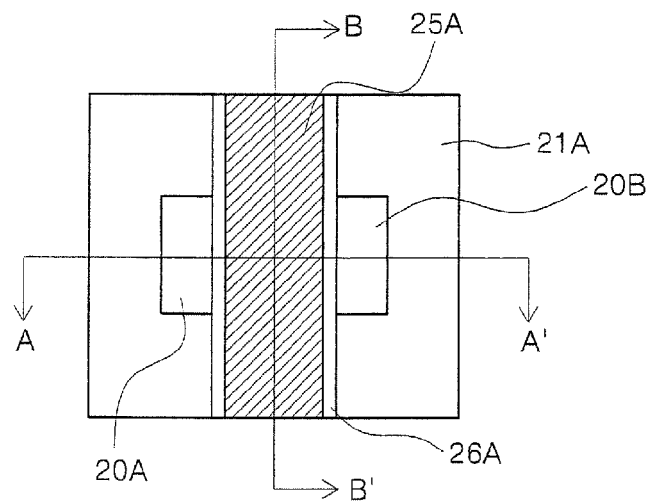
Figure 12B:
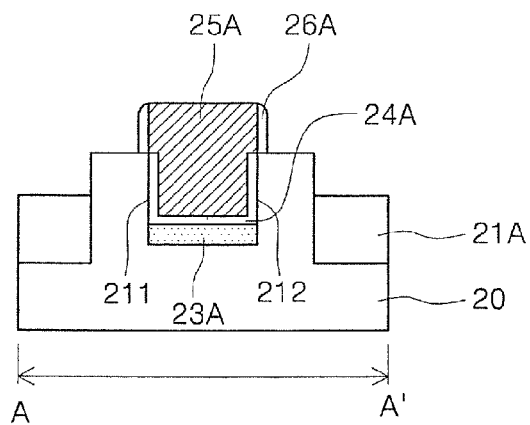
Figure 12C:
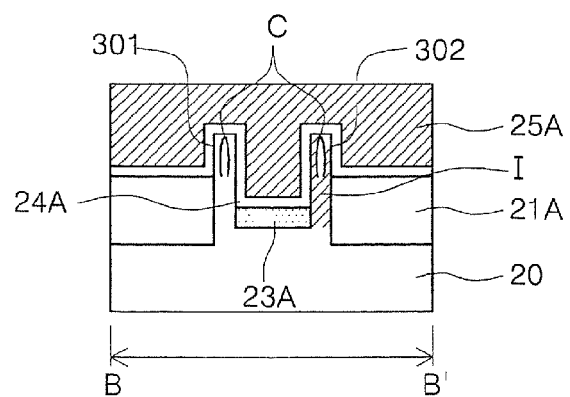

As illustrated in FIGS. 12A through 12C, a gate insulating layer 24A and a gate electrode 25A are formed on the first and second protrusions 301 and 302. In some embodiments of the present invention, the gate electrode 25A may be provided in the inner portion of the center trench 210 between the source and drain regions 20A and 20B, may have the same width as the center trench 210 and may also be provided on the upper surfaces and sidewalls of the first and second channel regions C. As further illustrated in FIG. 12A, a gate spacer 26A may be formed on the sidewalls of the gate electrode 25A.

In some embodiments of the present invention, the gate insulating layer 24A may include an oxide layer, a nitride layer, an aluminum oxide layer, a high dielectric layer and/or an insulating layer containing nano-crystalline silicon. In these embodiments of the present invention, the formation of the vertical doped layer I may be omitted.

Figure 13A:
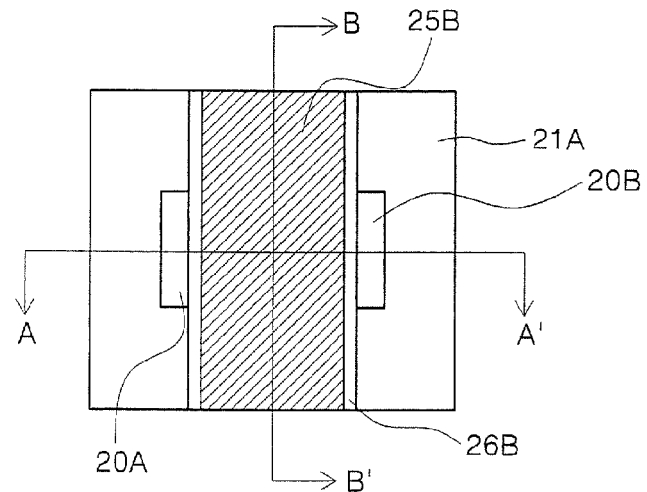
Figure 13B:
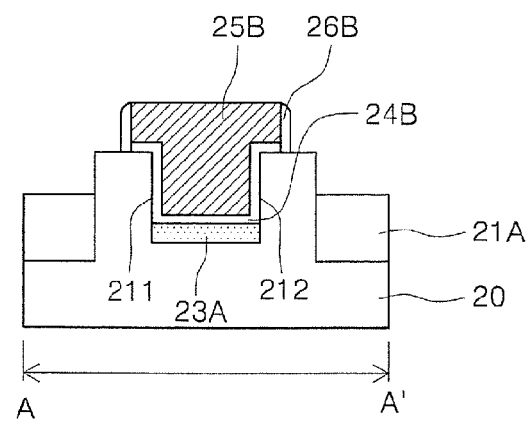
Figure 13C:
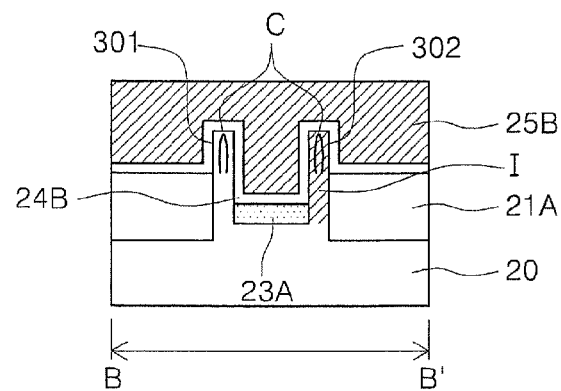

Referring now to FIGS. 13A through 13C, in further embodiments of the present invention, a gate insulating layer 24B and a gate electrode 25B may be formed, both of which are provided across the first and second protrusions 301 and 302 and on the upper surfaces and the sidewalls of the first and second protrusions 301 and 302 which define the first and second channel regions C. The gate electrode 25B may be formed in the inner portion of the center trench 210 between the source and drain regions 20A and 20B, on the upper surfaces of the source and drain regions 20A and 20B as well as the upper surfaces and the sidewalls of the first and second channel regions C, and across the first and second channel regions C. Subsequently, a gate spacer 26B is formed on the sidewalls of the gate electrode 25B.

Figure 14A:
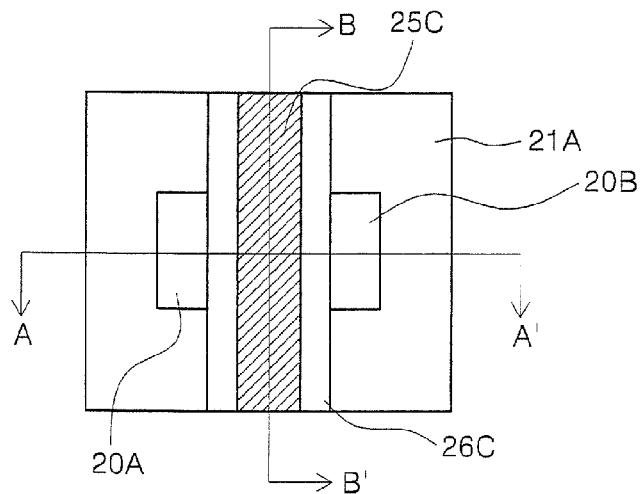
Figure 14B:
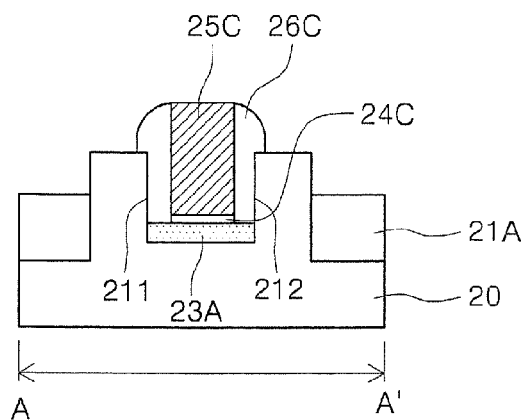
Figure 14C:
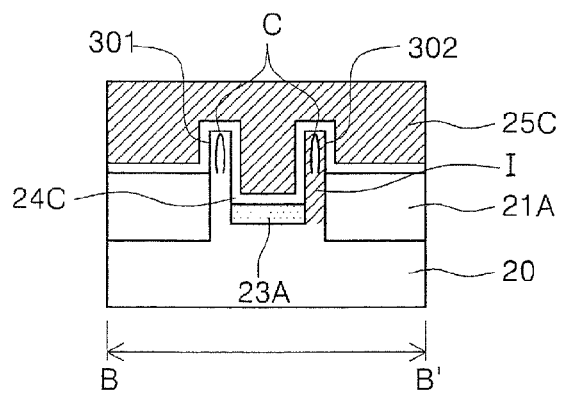

Referring now to FIGS. 14A through 14C, in still further embodiments of the present invention, a gate insulating layer 24C and a gate electrode 25C are formed across the first and second protrusions 301 and 302 and on the upper surfaces and the sidewalls of the first and second protrusions 301 and 302 which define the first and second channel regions C. In these embodiments, the gate electrode 25C is formed to have a width that is less than a width of the center trench 210 in the inner portion of the center trench 210 between the source and drain regions 20A and 20B, and formed on the upper surfaces and the sidewalls of the first and second channel regions C and across the first and second channel regions C. Subsequently, a gate spacer 26C is formed on the sidewalls of the gate electrode 25C and in the center trench 210.

Figure 15A:
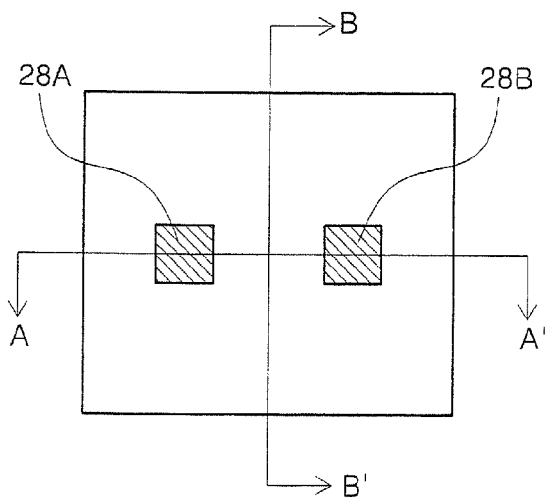
Figure 15B:
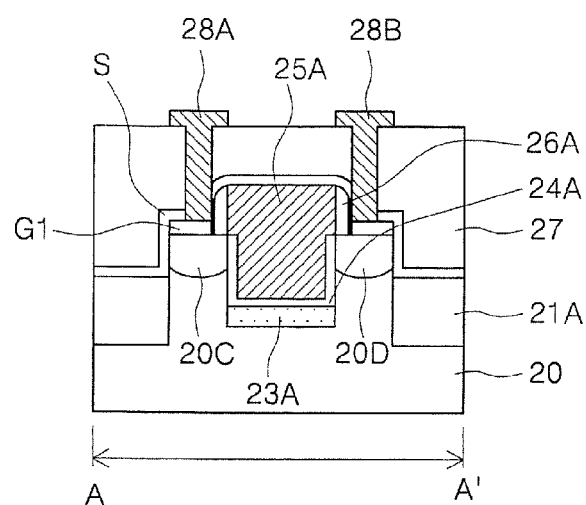
Figure 15C:
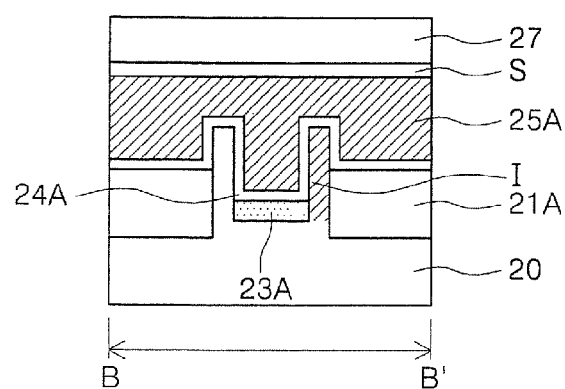

Referring now to FIGS. 15A through 15C, a silicon (Si), silicon germanium (SiGe), or germanium (Ge) layer G1 is formed on the source and drain regions 20A and 20B, and thereby raised source/drain regions may be formed. Ions are implanted into the source and drain regions 20A and 20B to form a source 20C and a drain 20D. A strain-inducing layer S may be formed on the integrated circuit substrate having the source 20C and the drain 20D. In some embodiments of the present invention, the strain-inducing layer S may include a silicon oxy-nitride (SiON) or silicon nitride (SiN) layer. The strain-inducing layer S may allow a change in the lattice constants of the first and second channel regions C between the source 20C and the drain 20D and an increase in charge mobility within the first and second channel regions C. An interlayer insulating layer 27 is formed on the integrated circuit substrate 20. The strain-inducing layer S and the interlayer insulating layer 27 are selectively etched to form contact holes exposing the source 20C and the drain 20D. Source and drain electrodes 28A and 28B are formed in the contact holes and are coupled to the source 20C and the drain 20D.

Figure 16A:
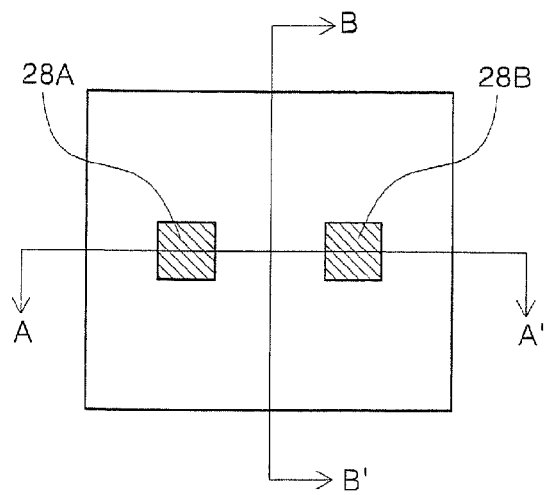
Figure 16B:
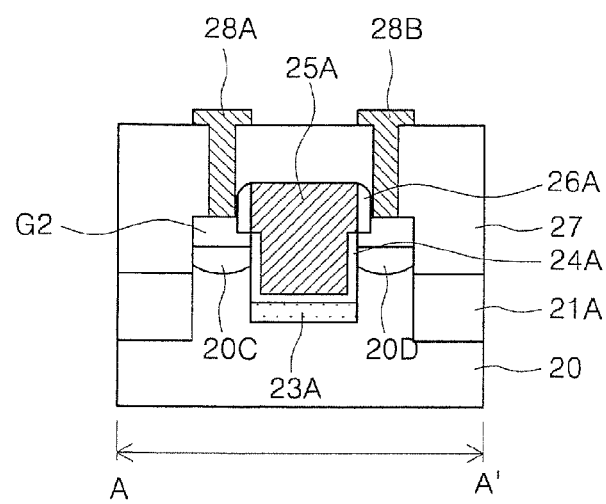
Figure 16C:
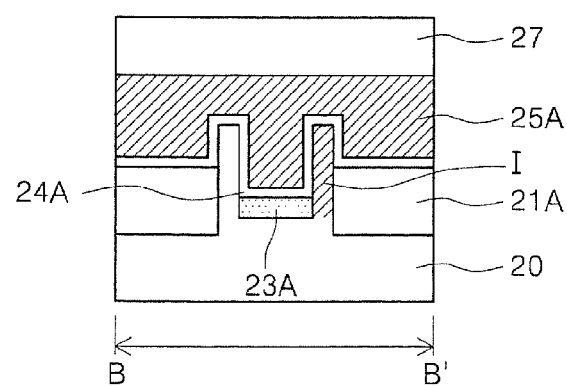

Referring now to FIGS. 16A through 16C, after forming the gate electrode 25A (FIG. 12B), 25B (FIG. 13B) and/or 25C (FIG. 14B) and the gate spacer 26A (FIG. 12B), 26B (FIG. 13B) and/or 26C (FIG. 14B), the upper portions of the source and drain regions 20A and 20B may be etched up to a region under the gate spacer 26A by, for example, wet etching, and a layer G2 including group IV elements and compounds of group IV elements may be formed on the etched region. Ions are implanted into the source and drain regions to form a source 20C and a drain 20D. The layer G2 may allow the lattice constants of the first and second channel regions C to be changed between the source 20C and the drain 20D and the charge mobility to increase within the first and second channel regions C. An interlayer insulating layer 27 is formed on the integrated circuit substrate 20, and is selectively etched to form contact holes exposing the source 20C and the drain 20D. A source electrode 28A and a drain electrode 28B are formed in the contact holes and are electrically coupled to the source 20C and the drain 20D through the contact holes.

Referring now to FIGS. 17A through 20C, processing steps in the fabrication of metal oxide semiconductor (MOS) transistors according to further embodiments of the present invention will be discussed. FIGS. 17A through 20A are top views illustrating processing steps in the fabrication of MOS transistors according to further embodiments of the present invention. FIGS. 17B through 20B are cross-sectional views taken along the line A-A' of FIGS. 17A through 20A, respectively, illustrating processing steps in the fabrication of MOS transistors according to some embodiments of the present invention. FIGS. 17C through 20C are cross-sectional views taken along the line B-B' of FIGS. 17A through 20A, respectively, illustrating processing steps in the fabrication of MOS transistors according to some embodiments of the present invention.

Figure 17A:
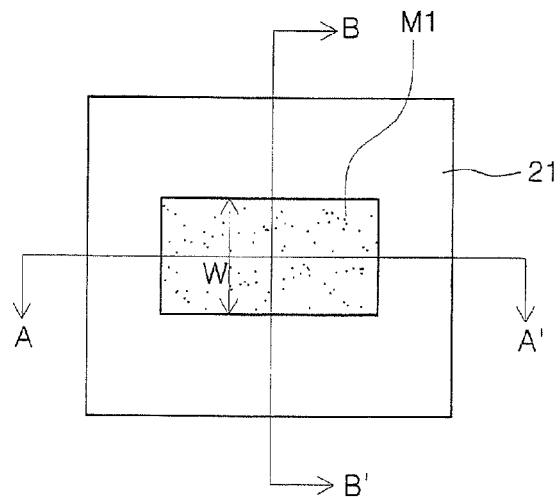
Figure 17B:
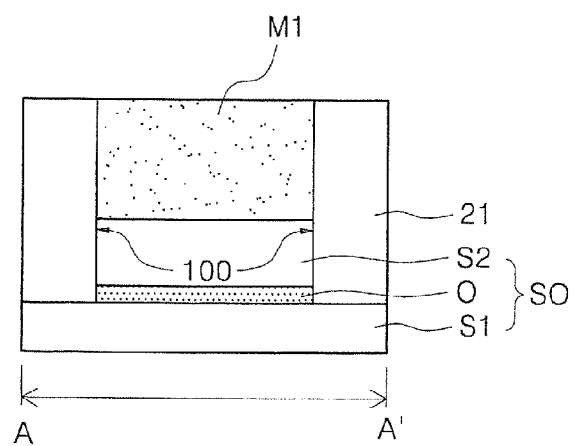
Figure 17C:
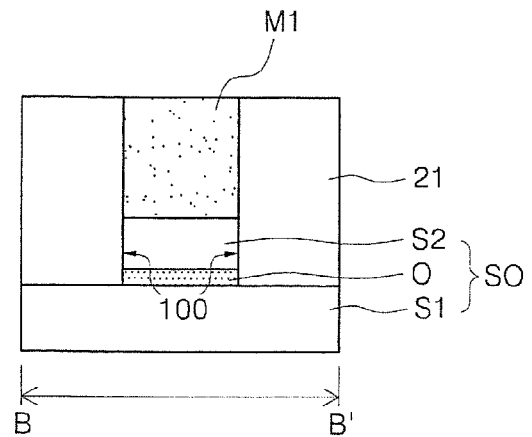

Referring now to FIGS. 17A through 17C, an active region masking pattern M1 is formed on an integrated circuit substrate S0. The integrated circuit substrate S0 may be include a silicon on insulator (SOI) substrate, a germanium on insulator (GOI) substrate or silicon-germanium on insulator (SGOI) substrate. The integrated circuit substrate S0 includes a supporting substrate S1, a buried insulating layer O and an active region substrate S2. The active region masking pattern M1 may include a nitride layer having a thickness of from about 800 Å to about 2,000 Å. Using the active region masking pattern M1 as an etch mask, the integrated circuit substrate S0 of the isolation region is etched to form an isolation trench 100 around the active region. In some embodiments of the present invention, the isolation trench 100 is formed such that a bottom surface of the isolation trench 100 is disposed under the buried insulating layer O. The isolation trench 100 may have a depth of from about 1,000 Å to about 2,000 Å.

An insulating layer 21 is formed on the integrated circuit substrate S0 including the isolation trench 100. The insulating layer 21 is planarized by, for example, blanket etching or Chemical-Mechanical Polishing (CMP), until a surface of the active region masking pattern M1 is exposed. In some embodiments of the present invention, the insulating layer 21 may include an oxide layer.

Figure 18A:
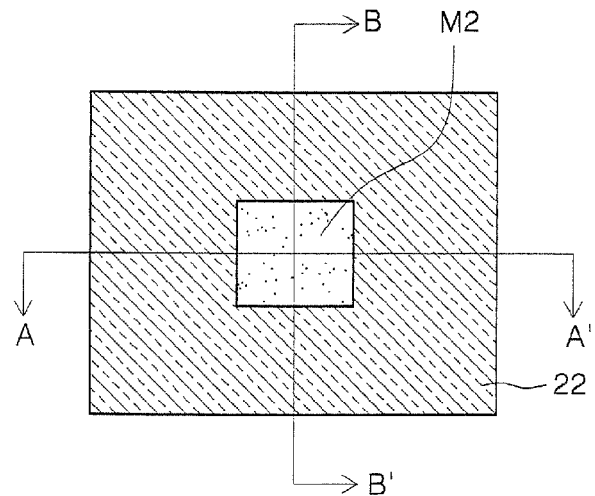
Figure 18B:
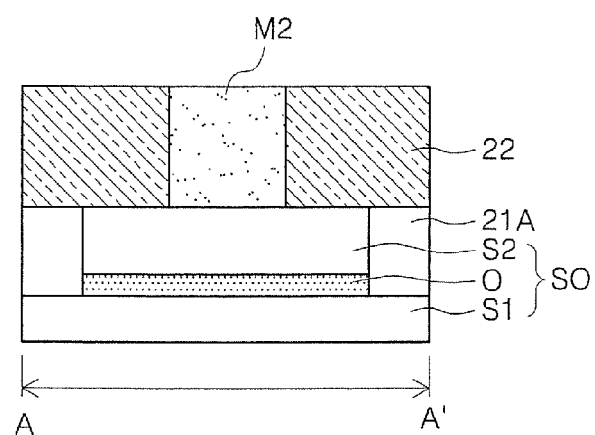
Figure 18C:
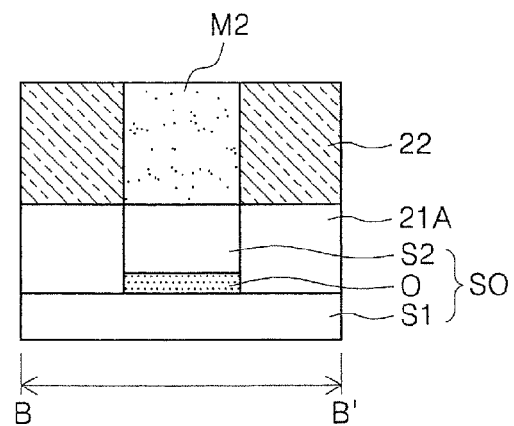

As illustrated in FIGS. 18A through 18C, the active region masking pattern M1 is selectively etched to form a source and drain region defining pattern M2. A masking layer 22 is formed on the integrated circuit substrate 20, and is planarized by, for example, blanket etching or Chemical-Mechanical Polishing (CMP), until a surface of the source and drain region defining pattern M2 is exposed. The masking layer 22 may include an oxide layer.

Figure 19A:
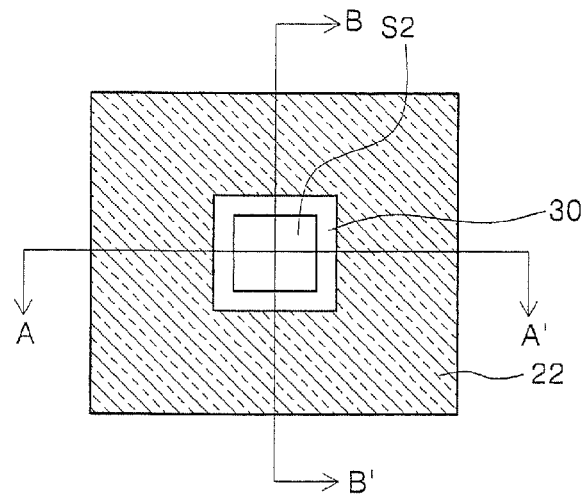
Figure 19B:
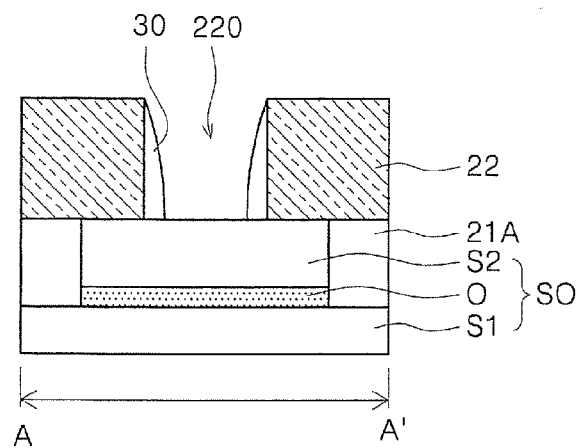
Figure 19C:
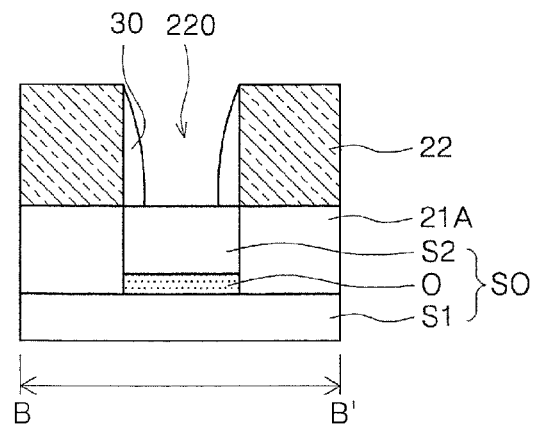

As illustrated in FIGS. 19A through 19C, by removing the source and drain region defining pattern M2, an opening 220 is formed in the masking layer 22 and, thus, a surface of the active region substrate S2 is exposed. A spacer 30 is formed on the sidewall of the opening 220. The spacer 30 may be formed by forming an insulating layer on the integrated circuit substrate S0 having the opening 220 and blanket etching the insulating layer. The insulating layer may include, for example, an oxide layer. The source and drain region defining pattern M2 may be removed by, for example, wet etching using phosphoric acid. An area of the surface of the active region substrate S2 exposed after forming the spacer 30 may be determined based on the widths of the source and drain region defining pattern M2 and the spacer 30. Dimensions of the center trench formed between the source and drain regions may be determined by the opening 220 and the spacer 30. Furthermore, a channel width may be determined based on the width of the spacer 30.

Figure 20A:
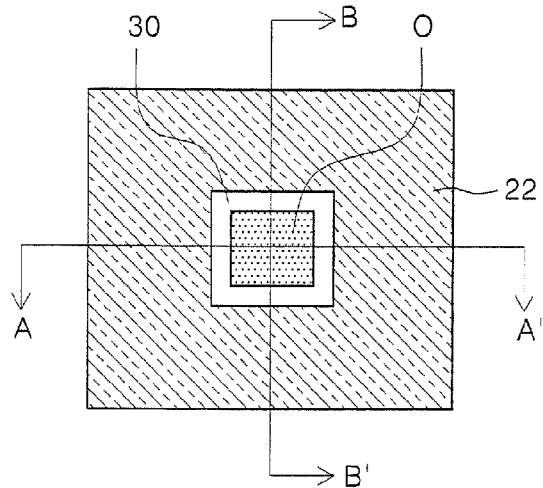
Figure 20B:
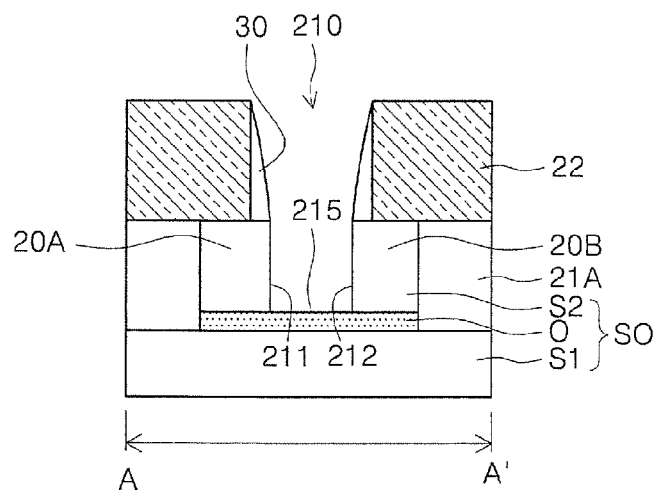
Figure 20C:
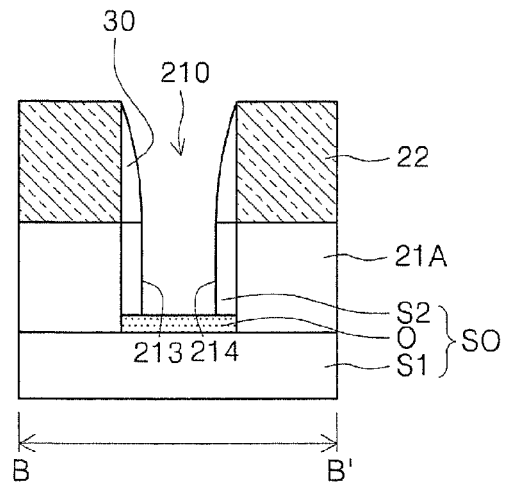

As illustrated in FIGS. 20A through 20C, the integrated circuit substrate S0 is etched to form a center trench 210 between the source and drain regions. The center trench 210 may include a first sidewall 211 which contacts a source region 20A, a second sidewall 212 which faces the first sidewall 211 and contacts a drain region 20B, third and fourth sidewalls 213 and 214 which are formed between the first and second sidewalls 211 and 212 and face each other, and a bottom surface 215. The buried insulating layer O may be formed on the bottom surface 215 of the center trench 210 such that the buried insulating layer O is exposed. The buried insulating layer O exposed on the bottom surface 215 of the center trench 210 may allow the process of forming the channel formation prevention region on the bottom surface of the center trench 210 to be omitted in the following processes.

Figure 21A:
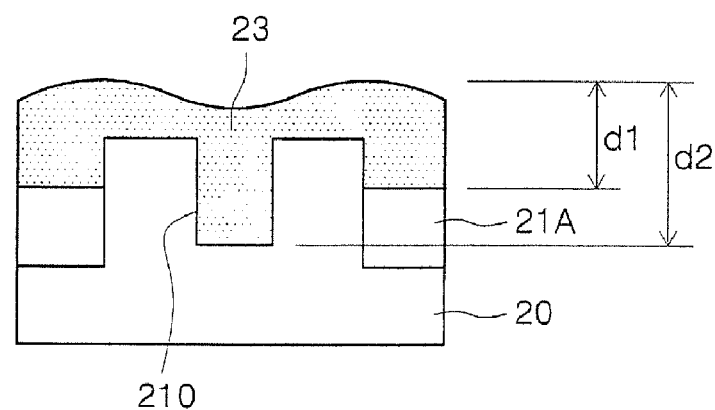
FIGS. 21A and 21B are cross-sectional views illustrating processing steps in the fabrication a channel formation prevention region of MOS transistors according to some embodiments of the present invention.
Figure 21B:
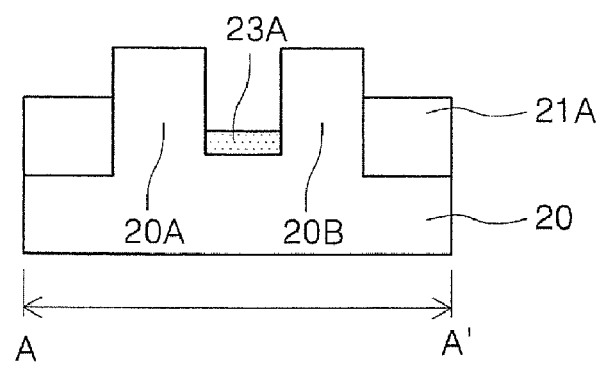

The channel formation prevention region 23A may be formed using a variety of different methods. For example, FIGS. 21A and 21B are cross-sectional views illustrating processing steps in the fabrication of a channel formation prevention region of MOS transistors according to some embodiments of the present invention. As illustrated in FIG. 21A, a material layer having a good gap filling characteristic is deposited on the integrated circuit substrate to form a channel prevention layer 23. A depth d2 from a surface of the channel prevention layer 23 to a floor of the center trench 210 is larger than a depth d1 from the surface of the channel prevention layer 23 to the surface of the isolation layer 21A. The channel prevention layer 23 may be etched to provide a channel formation prevention region 23A on the floor of the center trench 210 as illustrated in FIG. 21B. The channel prevention layer 23 may be formed using, for example, a wet etch. The channel prevention layer 23 may be formed by, for example, deposition of a high-density plasma (HDP) oxide layer, a borophosphosilicate glass (BPSG) layer or a phosphosilicate glass (PSG) layer. The wet etching may be performed using, for example, a mixture of hydrogen fluoride (HF) and water ($H_2O$) or a mixture of HF and Ammonium Fluoride ($NH_4F$).

Figure 22A:
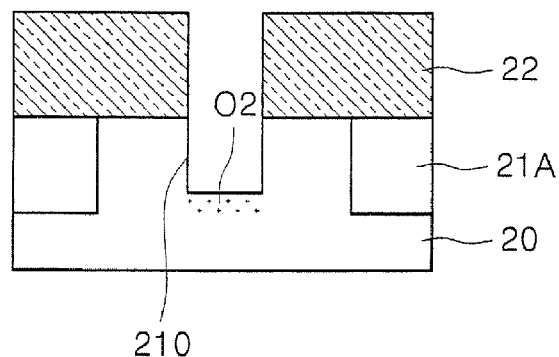
FIGS. 22A and 22B are cross-sectional views illustrating processing steps in the fabrication of a channel formation prevention region of MOS transistors according to further embodiments of the present invention.
Figure 22B:
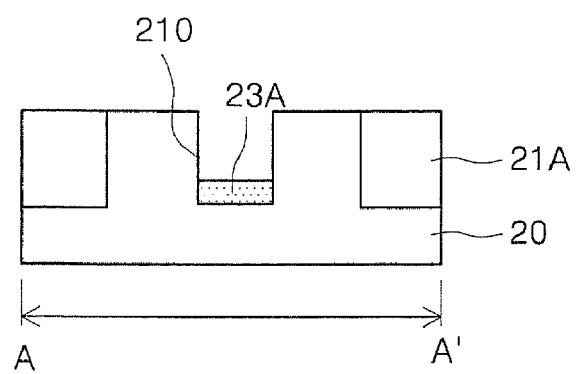

Referring now to FIGS. 22A and 22B, processing steps in the fabrication of a channel formation prevention region according to further embodiments of the present invention will be discussed. As illustrated in FIG. 22A, after formation of the center trench 210, oxygen ions may be implanted into the floor of the center trench 210 using the mask layer 22 as an ion implantation mask. In embodiments of the present invention including the spacer 30 on the sidewall of the opening 220 (FIG. 19C), the spacer 30 may also function as the ion implantation mask. A heat treatment is carried out and the channel formation prevention region 23A is formed on the floor of the center trench 210 and the mask layer 22 is removed as illustrated in FIG. 22B.

It will be understood that although the oxygen ions are discussed herein, channel formation prevention regions may be formed by implanting conductive ions similar to those implanted for adjusting a threshold voltage of the channel without departing from the scope of the present invention. The ion implantation concentration of the channel formation prevention region may be higher than that of the channel region. Thus, the threshold voltage of the channel formation prevention region may be higher than an operating voltage of a device such that it may be possible to reduce the likelihood that the channel will be formed on the floor of the center trench 210.

As discussed briefly above with respect to FIGS. 12A to 15C, MOS transistors according to some embodiments of the present invention include at least two channel regions C, which are spaced a constant distance apart from each other and are protruded from an integrated circuit substrate 20. Ends of each of the channel regions C are coupled to a source region 20A and a drain region 20B, respectively. The upper surfaces of the source and drain regions 20A and 20B may have the same height as upper surfaces of first and second protrusions 301 and 302. In some embodiments of the present invention, a width of the source and drain regions 20A and 20B may have the same width as the sum of widths of the first and second protrusions 301 and 302 and the width of the center trench 210.

A gate insulating layer 24A and a gate electrode 25A are disposed on the upper surfaces and sidewalls of the first and second protrusions 301 and 302 defining the channel regions C and across the first and second protrusions 301 and 302. The gate electrode 25A is provided in the inner portion of the center trench 210 between the source and drain regions 20A and 20B and on the upper surfaces and sidewalls of the channel regions C with the same width as the center trench 210. Gate spacers 26A are provided on the sidewalls of the gate electrode 25A.

Alternatively, as illustrated in FIGS. 13A through 13C, a gate insulating layer 24B and a gate electrode 25B are disposed on the upper surfaces and sidewalls of the first and second protrusions 301 and 302 defining the channel regions C and across the first and second protrusions 301 and 302. In these embodiments of the present invention, the gate electrode 25B is disposed in the inner portion of the center trench 210 between the source and drain regions 20A and 20B and on parts of the upper surfaces of the source and drain regions 20A and 20B as well as the upper surfaces and sidewalls of the channel regions C. The channel regions C may have different doping concentrations. Gate spacers 26B are disposed on the sidewalls of the gate electrode 25B.

According to still further embodiments of the present invention, as illustrated in FIGS. 14A through 14C, a gate insulating layer 24C and a gate electrode 25C are disposed on the upper surfaces and sidewalls of the first and second protrusions 301 and 302 defining the channel regions C and across the first and second protrusions 301 and 302. In these embodiments of the present invention, the gate electrode 25C has a width less than a width of the center trench 210 in the inner portion of the center trench 210 between the source and drain regions 20A and 20B and is disposed on the upper surfaces and sidewalls of the channel regions C. Gate spacers 26C are provided on the sidewalls of the gate electrode 25C and in the center trench 210.

As discussed above with respect to FIGS. 15A through 15C, a selective Si, SiGe or Ge layer G1 is disposed on the upper surfaces of the source and drain regions 20A and 20B of the MOS transistor shown in FIGS. 12A through 12C, and thereby raised source/drain regions may be formed. The source and drain regions include a source 20C and a drain 20D, respectively. A strain-inducing layer S may be disposed on the integrated circuit substrate having the source 20C and the drain 20D. The strain-inducing layer S may include a SiON or SiN layer. The strain-inducing layer S may allow the lattice constants of the channel regions C to be changed between the source 20C and the drain 20D and the charge mobility within the channel regions C to be increased. An interlayer insulating layer 27 is disposed on the integrated circuit substrate 20. Contact holes are provided in the insulating layer 27 exposing the source 20C and the drain 20D. A source electrode 28A and a drain electrode 28B are provided in the contact holes and are electrically coupled to the source 20C and the drain 20D, respectively.

According to various embodiments of the present invention, a trench is formed in an integrated circuit substrate between source/drain regions to define a three dimensional channel. Thus, it may be possible to effectively reduce the possibility that the source/drain contact areas are reduced. In other words, a three dimensional channel region may be formed without substantially decreasing an area of an active region defined by forming an isolation region.

Furthermore, a source and drain region defining pattern may be formed by patterning an active region masking pattern using a photolithography process. An isotropic etching process may be preformed to form a channel region defining pattern, the width and length of which are smaller than a width and length of the source and drain region defining pattern. Thus, edges of the active regions may be exposed by the formation of the channel region defining pattern. An etching process may be performed using the channel region defining pattern as an etch mask to form a channel having a fine line width in the integrated circuit substrate between the source and drain regions. Thus, it may be possible to form the channel region having a width that is smaller than possible with conventional channel regions formed using a photolithography process.

Furthermore, the channel region defining pattern may be formed by patterning the active region mask pattern to form an STI isolation layer. Thus, a process of depositing a layer for forming the channel region defining pattern may be omitted. Accordingly, it may be possible to simplify an overall process of fabricating integrated circuit devices and save production costs.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A unit cell of a metal oxide semiconductor (MOS) transistor comprising:
   an integrated circuit substrate;
   a MOS transistor on the integrated circuit substrate, the MOS transistor having a source region, a drain region and a gate region, the gate region being between the source region and the drain region;
   first and second channel regions between the source and drain regions, the channel region being defined by first and second spaced apart protrusions in the integrated circuit substrate separated by a trench region, the first and second protrusions extending away from the integrated circuit substrate;
   a gate electrode in the trench region extending on sidewalls of the first and second spaced apart protrusions and on at least a portion of surfaces of the first and second spaced apart protrusions; and
   an isolation layer on the integrated circuit substrate such that the source region, drain region, gate region and first and second channel regions are free of the isolation layer, the isolation layer having an upper surface that is lower than upper surfaces of the first and second channel regions.

2. The unit cell of claim 1, wherein a bottom surface of the trench region is higher than a bottom surface of the isolation layer on the integrated circuit substrate.

3. The unit cell of claim 2, wherein the bottom surface of the trench region is substantially planar with or lower than the upper surface of the isolation layer.

4. The unit cell of claim 1, wherein the first channel region is electrically coupled to the source region at a first end of the first channel region and to the drain region at a second end of the first channel region and wherein the second channel region is electrically coupled to the source region at a first end of the second channel region and the drain region at a second end of the second channel region.

5. The unit cell of claim 1, wherein the gate electrode further extends on surfaces of the source and drain regions and wherein a width of the gate electrode is greater than a width of the trench region.

6. The unit cell of claim 1, wherein the gate electrode has a width that is equal to the width of the trench region.

7. The unit cell of claim 1, further comprising a gate spacer on sidewalls of the trench region, wherein the gate electrode is provided on the gate spacer such that a width of the gate electrode is less than a width of the trench region.

8. The unit cell of claim 1, further comprising a conformal gate insulating layer between the first and second protrusions and the gate electrode.

9. The unit cell of claim 8, wherein the gate insulating layer comprises at least one of an oxide layer, a nitride layer, an aluminum layer, a high dielectric layer and an insulating layer including nano-crystalline silicon.

10. The unit cell of claim 8, further comprising a channel formation prevention region on a floor of the trench region, the channel formation prevention region being positioned between the integrated circuit substrate and the gate insulating layer.

11. The unit cell of claim 1, further comprising at least one of a silicon layer, a germanium layer and a silicon germanium layer on the source and drain regions.

12. The unit cell of claim 1, further comprising a buried insulating layer on a floor of the trench region.

13. The unit cell of claim 1, further comprising a strain inducing layer on the integrated circuit substrate including the gate electrode.

14. The unit cell of claim 1, wherein corners of the first and second channel regions and the trench region are slightly rounded.

15. The unit cell of claim 1, wherein the first channel region has a first doping concentration and the second channel region has a second doping concentration, different from the first concentration.

16. A metal oxide semiconductor (MOS) transistor, comprising:
   an integrated circuit substrate;
   an active region protruded from the integrated circuit substrate;
   an isolation layer around the active region and having an upper surface lower than an upper surface of the active region;
   at least one center trench defining a plurality of channel regions and source and drain regions, the plurality of channel regions being recessed from a center portion of the active region and spaced apart from each other, the source and drain regions being connected with both ends of each of the plurality of channel regions; and
   a gate electrode on the upper surfaces and sidewalls of the plurality of channel regions.

* * * * *